United States Patent
Lee et al.

(10) Patent No.: US 7,048,612 B2
(45) Date of Patent: May 23, 2006

(54) METHOD OF CHEMICAL MECHANICAL POLISHING

(75) Inventors: Sung-Bae Lee, Hwasung-si (KR); Sang-Rok Ha, Seoul (KR); Hyo-Jong Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 85 days.

(21) Appl. No.: 10/920,323

(22) Filed: Aug. 18, 2004

(65) Prior Publication Data

US 2005/0070091 A1    Mar. 31, 2005

(30) Foreign Application Priority Data

Sep. 8, 2003    (KR) ...................... 10-2003-0062751

(51) Int. Cl.
*B24B 1/00* (2006.01)
(52) U.S. Cl. ............................ 451/36; 451/41; 451/57; 451/59; 451/60
(58) Field of Classification Search ................. 451/5, 451/6, 8, 36, 41, 57, 59, 60, 63; 216/88, 216/89, 90; 438/690, 691, 692, 693
See application file for complete search history.

(56) References Cited

U.S. PATENT DOCUMENTS

| | | | |
|---|---|---|---|
| 6,186,864 B1 * | 2/2001 | Fisher et al. ................... | 451/6 |
| 6,589,099 B1 | 7/2003 | Haggart, Jr. et al. | |
| 6,866,559 B1 * | 3/2005 | Lehman et al. ................ | 451/8 |
| 6,942,546 B1 * | 9/2005 | Desai et al. ................... | 451/8 |

FOREIGN PATENT DOCUMENTS

| | | |
|---|---|---|
| JP | 2001-044158 | 2/2001 |
| JP | 2002-075939 | 3/2002 |
| KR | 1996-0035865 | 10/1996 |
| KR | 2001-0057477 | 7/2001 |

* cited by examiner

*Primary Examiner*—Timothy V. Eley
(74) *Attorney, Agent, or Firm*—Lee & Morse, P.C.

(57) ABSTRACT

A method of chemical mechanical polishing that polishes a substrate by abrading a target material formed on the substrate with a polishing pad containing a slurry includes setting a polishing end time, at which time a predetermined thickness of the target material will have been removed from the substrate by polishing, polishing the substrate to remove the predetermined thickness of the target material, and increasing a level of byproduct contamination in the polishing pad to decrease a polishing rate, while polishing the substrate, so that the polishing rate decreases to approximately zero at the polishing end time.

23 Claims, 5 Drawing Sheets

METHOD OF CHEMICAL MECHANICAL POLISHING

BACKGROUND OF THE INVENTION

1. Field of the Invention

The present invention relates to a method of fabricating a semiconductor device. More particularly, the present invention relates to a method of controlling a chemical mechanical polishing for forming a conductive plug or planarizing an insulation layer.

2. Description of the Related Art

Chemical Mechanical Polishing (CMP) is a process that is useful to planarize an insulation layer or to form a conductive plug. It is necessary that the CMP be completed at a proper time in order to polish a target material down to a predetermined thickness.

Methods for controlling an end of a CMP process may be classified into two types. The first type is a time controlled method, in which the polishing is performed for a predetermined time that has been previously set. The second type is an end point detection method, which uses an end point detector. The end point detection method has an advantage in that it is able to detect the end point of the CMP process in real time.

Various methods for detecting an end point have been introduced. One of the end point detection methods uses optical detection. A method using optical detection measures a remaining thickness or species of a material. In this method of end point detection, light having a specified wavelength range is projected onto and reflected from a wafer that is being polished. Then, the spectrum of the reflected light is analyzed to measure a remaining thickness or species of the material. Since the optical detection analyzes a surface of wafer being polished, the end point of the CMP process can be measured in real time independent of contamination of a slurry or an abrasion of an assembly. However, it is difficult to measure a thickness of multiple layers. Thus, a thickness measurement is not very accurate.

Another method of end point detection is a current detection method. In the current detection method, an end point is detected by measuring a current caused by a torque of a carrier that supports a wafer being polished. Similarly with the optical detection method, the current detection method can detect an end point in real time. The current detection has a disadvantage in that the torque and the current are irregular due to a density of patterns, a condition of the slurry, and an abrasion of the assembly.

In view of these disadvantages, the time control method is usually employed to control a CMP process. As mentioned above, in the time control method, the polishing process is performed for a predetermined process time, which has been previously set in accordance with a predetermined polishing rate based on a target material and a slurry. According to this method, an end point detector is not necessary, and the process is accurately controlled in the early state of the process because the polishing rate is maintained at the predetermined polishing rate. However, as an operation time of the polishing equipment progresses, the polishing rate begins to vary from the predetermined polishing rate.

Figure 1:
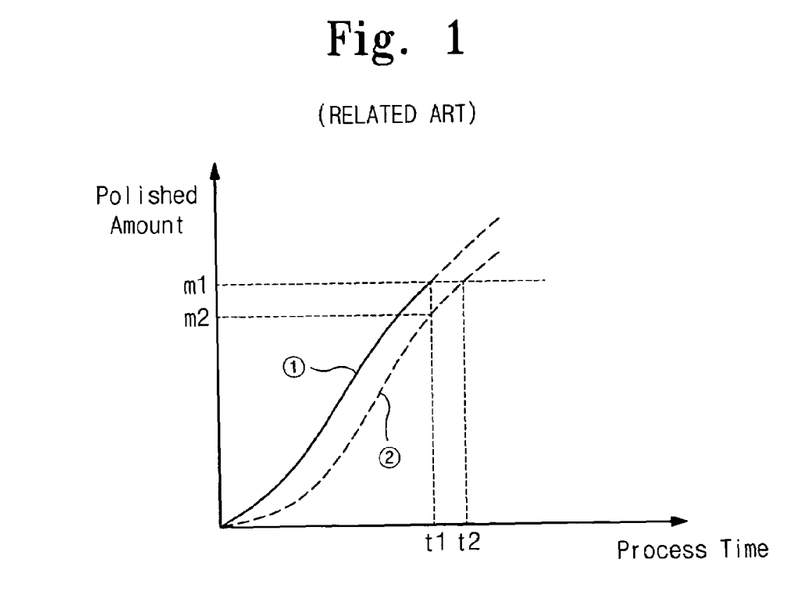
FIG. 1 is a graph illustrating results of a CMP using a conventional time control method for controlling an end point of the CMP.

FIG. 1 is a graph illustrating results of a CMP using a conventional method for controlling an end point of the CMP. In the graph, the abscissa indicates a process time and the ordinate indicates a polished amount.

Referring to FIG. 1, during the CMP process, a polishing pad, which polishes, i.e., abrades, the substrate, is conditioned by continuously supplying and exhausting a slurry, which contains byproducts, to and from the polishing pad while the substrate is being polished. Accordingly, the polished amount increases with respect to time, as shown in curve 1. Due to the time control method, the polishing is stopped at a predetermined polishing end time t1. The polishing end time is determined based on experimental data, which consists of polished amounts as compared to process times. The polishing end time can be selected at a time corresponding to a target value m1 of the polishing amount. As illustrated in FIG. 1, the chemical mechanical polishing continuously has a high polishing rate, i.e., the polished amount is steadily increasing, at the polishing end point because the polishing pad is being continuously conditioned.

However, an error with respect to the end time may occur during the CMP because the assembly becomes worn away and the polishing pad becomes glazed as an operation time of the polishing equipment elapses. More specifically, as the operation time of the polishing equipment elapses, the polishing rate decreases and only an amount m2 is polished by time t1. Thus, additional time t2 is necessary to polish the target value m1 of the target layer, as shown in curve 2. Since a variation of the polishing amount exists in the vicinity of the polishing end time, in the event that the polishing is stopped at the predetermined polishing end time t1, it is unavoidable that an error with respect to the polishing amount is high.

SUMMARY OF THE INVENTION

The present invention is therefore directed to a CMP method that is able to accurately control an end point of the CMP, which substantially overcomes one or more of the problems due to the limitations and disadvantages of the related art.

A feature of the present invention is to provide a method of chemical mechanical polishing process that is capable of detecting an end point even if equipment for chemical mechanical polishing has been operating for an extended period of time.

Another feature of the present invention is to provide a method of chemical mechanical polishing that is capable of detecting an end point in real time by reflecting a condition of the polishing without an end point detector.

It is therefore a feature of an embodiment of the present invention to provide a method of chemical mechanical polishing that polishes a substrate by abrading a target material formed on the substrate with a polishing pad containing a slurry including setting a polishing end time, at which time a predetermined thickness of the target material will have been removed from the substrate by polishing, polishing the substrate to remove the predetermined thickness of the target material, and increasing a level of byproduct contamination in the polishing pad to decrease a polishing rate, while polishing the substrate, so that the polishing rate decreases to approximately zero at the polishing end time.

In the method, increasing the level of byproduct contamination in the polishing pad may include reducing an exhaust rate of the slurry from the polishing pad. Alternatively, increasing the level of byproduct contamination in the polishing pad may include reducing a supply rate of the slurry to the polishing pad. As a further alternative, increasing the level of byproduct contamination in the polishing pad may include blocking a supply of the slurry to the polishing pad and blocking an exhaust of the slurry from the polishing pad.

Polishing the substrate may use a slurry having a polishing selectivity that is lower with respect to the target material than to an under-layer and a polishing rate that is higher with respect to the target material than the under-layer.

The method may further include polishing the substrate using a slurry having a polishing selectivity that is higher with respect to the target material than to an under-layer, after the polishing end time.

Alternatively, polishing the substrate may include polishing the substrate using a first slurry having a low polishing selectivity with respect to the target material relative to an under-layer and a polishing rate that is higher with respect to the target material than an under-layer, until the polishing end time and polishing the substrate using a second slurry having a polishing selectivity that is higher with respect to the target material than to the under-layer, after the polishing end time.

It is therefore another feature of an embodiment of the present invention to provide a method for polishing a substrate, on which a target material is formed on an under-layer, by abrading the target material with a polishing pad containing a slurry including setting a polishing end time, at which time a predetermined thickness of the target material will have been removed from the substrate by polishing, polishing the substrate to remove the predetermined thickness of the target material, and increasing a level of byproduct contamination in the polishing pad to decrease a polishing rate, while polishing the substrate, so that the polishing rate decreases to approximately zero at the polishing end time, and stopping the polishing at the polishing end time.

In the method, increasing the level of byproduct contamination in the polishing pad to decrease the polishing rate may include reducing a supply rate of the slurry to the polishing pad. Alternatively, increasing the level of byproduct contamination in the polishing pad to decrease the polishing rate may include reducing an exhaust rate of the slurry from the polishing pad. As a further alternative, increasing the level of byproduct contamination in the polishing pad to decrease the polishing rate may include blocking a supply of the slurry to the polishing pad and blocking an exhaust of the slurry from the polishing pad.

In the method, the substrate may be polished by a slurry having a polishing selectivity that is lower with respect to the target material than to the under-layer and a polishing rate that is higher with respect to the target material.

The method may further include polishing the substrate using a slurry having a polishing selectivity that is higher with respect to the target material than to an under-layer, after the polishing end time.

Polishing the substrate may include polishing the substrate using a first slurry having a low polishing selectivity with respect to the target material relative to an under-layer and a polishing rate that is higher with respect to the target material than the under-layer, until the polishing end time and polishing the substrate using a second slurry having a polishing selectivity that is higher with respect to the target material than to the under-layer, after the polishing end time.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Korean Patent Application No. 2003-62751, filed on Sep. 8, 2003, in the Korean Intellectual Property Office, and entitled: "Method for Chemical Mechanical Polishing," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art.

Figure 2:
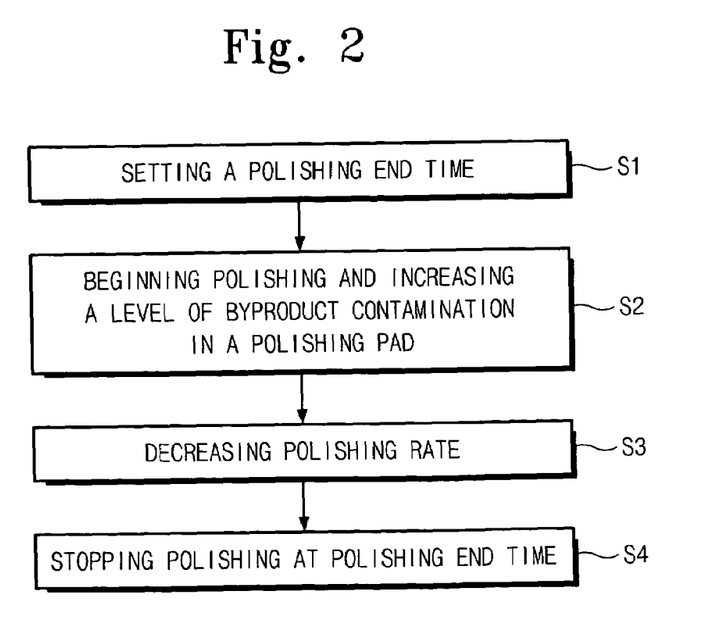
FIG. 2 is a flow chart of a method of chemical mechanical polishing using a control method according to an embodiment of the present invention.

FIG. 2 is a flow chart of a method of CMP using a control method according to an embodiment of the present invention.

Figure 3:
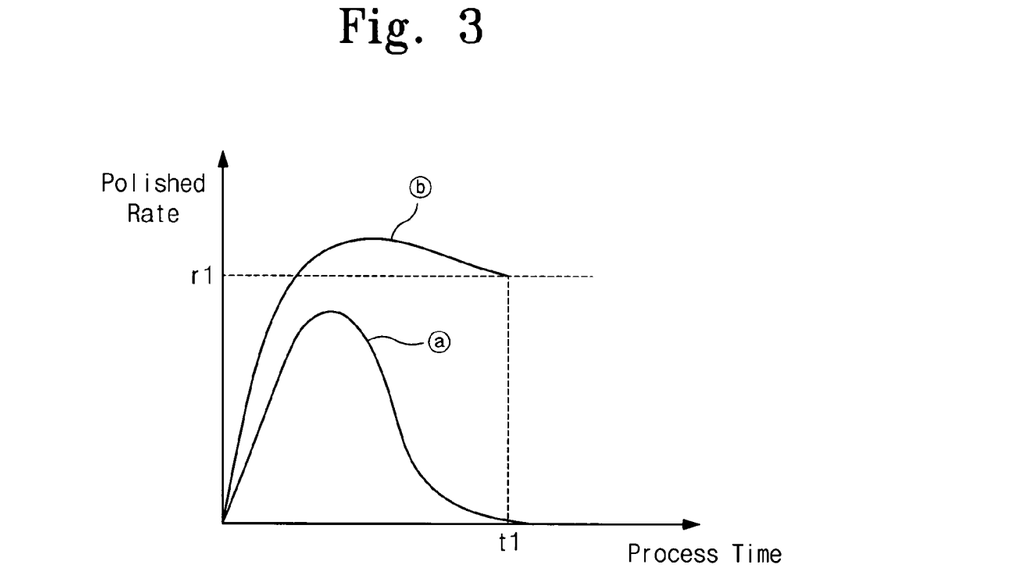
FIG. 3 is a graph illustrating polishing rate with respect to time of a method for controlling an end point of a CMP according to an embodiment of the present invention.

FIG. 3 is a graph illustrating polishing rate with respect to time of a method for controlling an end point of a CMP according to an embodiment of the present invention.

Figure 4:
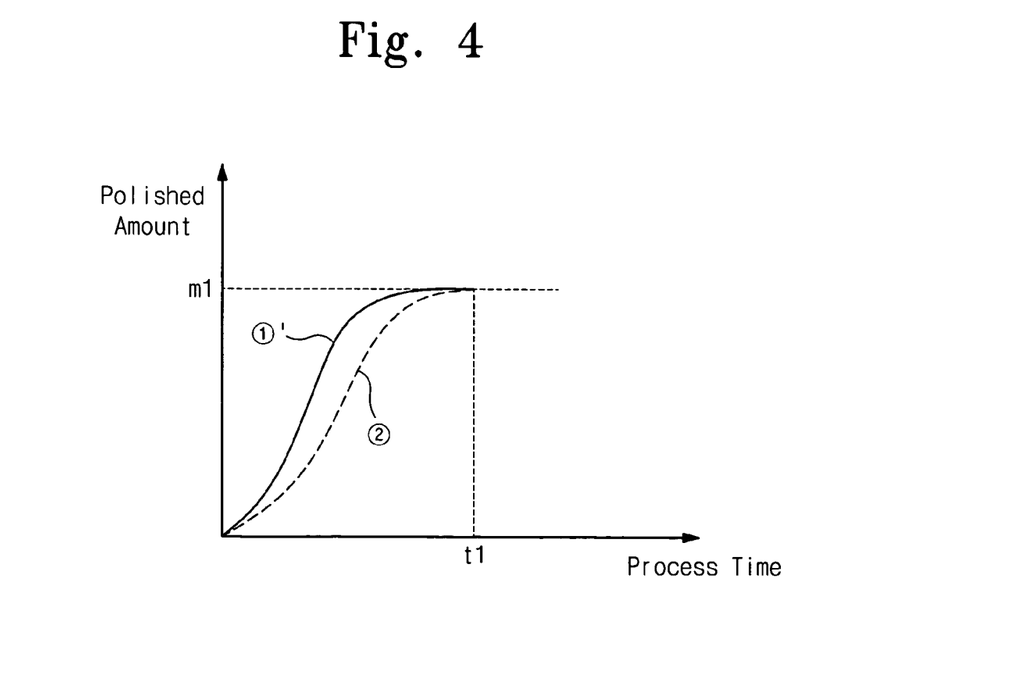
FIG. 4 is a graph illustrating polished amount with respect to time of a method for controlling an end point of a CMP according to an embodiment of the present invention.

FIG. 4 is a graph illustrating polishing amount with respect to time of a method for controlling an end point of a CMP according to an embodiment of the present invention.

Referring to FIG. 2, in step S1, a polishing end time t1 is set.

In step S2, a polishing pad containing a slurry contacts a substrate and the substrate is rotated relative to the polishing pad so that the polishing pad begins polishing, i.e., abrading, the substrate. During this polishing, a level of byproduct contamination in the polishing pad is increased.

In step S3, a polishing rate begins to decrease due to the increase in the level of byproduct contamination in the polishing pad. As shown in polishing rate curve a in FIG. 3, as a level of byproduct contamination increases, the polishing rate decreases until the polishing rate is approximately zero at the polishing end time t1. As shown in polishing amount curve 1' in FIG. 4, the polishing amount is approximately equal to the target value m1 in the vicinity of the polishing end time t1.

In step S4, the polishing is stopped at the polishing end time t1, at which time a predetermined amount, i.e., thickness, of a target material, i.e., the target value m1, will have been removed from the target layer on the substrate by polishing. As shown in FIG. 3, since the polishing rate approximately equals zero at the polishing end time t1 in the control method of the present invention, the polishing is spontaneously stopped at the polishing end time t1. In the conventional method, as shown in curve b of FIG. 3, since the polishing rate r1 is still relatively high at the polishing end time t1, a polishing error is high when the actually necessary end point differs from the polishing end time t1.

Further, according to the present invention, although equipment may be operated for an extended period of time, which causes a decrease in the polishing rate curve as shown by curve 2' of FIG. 4 and the actually necessary end point becomes different from the polishing end time t1, the polishing amount converges on the target value m1 and the polishing error can be reduced because the polishing rate is approximately equal to zero in the vicinity of the polishing end time t1. Thus, it is preferable that the polishing end time is determined to be a time after the polishing rate has decreased to approximately zero.

By adjusting a supply rate and an exhaust rate of the slurry, a level of byproduct contamination in the polishing pad can be controlled. A polishing end time with respect to the supply rate and/or the exhaust rate of the slurry can be experimentally obtained. Accordingly, an appropriate polishing end time can be determined and set according to the supply rate and/or the exhaust rate of the slurry.

A CMP process may be employed to planarize a target layer that is formed on an under-layer. Referring to FIG. 4, the target value m1 of the polishing amount represents a polishing amount of the target layer. Since the polishing rate approximately equals zero at the polishing end time t1, it is preferable that the slurry used in the polishing process has a high polishing rate with respect to the target layer. As shown in FIG. 3, a maximum polishing rate of the present invention, as shown in curve a is lower than that of a conventional method as shown in curve b. Although use of the present invention may increase the processing time as compared with the conventional process if both use the same slurry, this may be overcome by using the present invention with a slurry having a higher polishing rate than may be used by the conventional process. Since the polishing rate is still high at the polishing end time in the conventional process, and thus any polishing after the end time will significantly effect the resultant substrate, the conventional process is limited in how high of a polishing rate that a slurry used may have.

After the initial polishing is completed and the polishing end time is reached, the present invention may further perform an additional polishing using a second slurry having a polishing selectivity that is higher with respect to the target layer than to an under-layer beneath the target layer. In addition, the present invention can be selectively employed whether the target layer is polished using a slurry having a high polishing rate or is additionally polished after the main polishing is performed.

Figure 5:
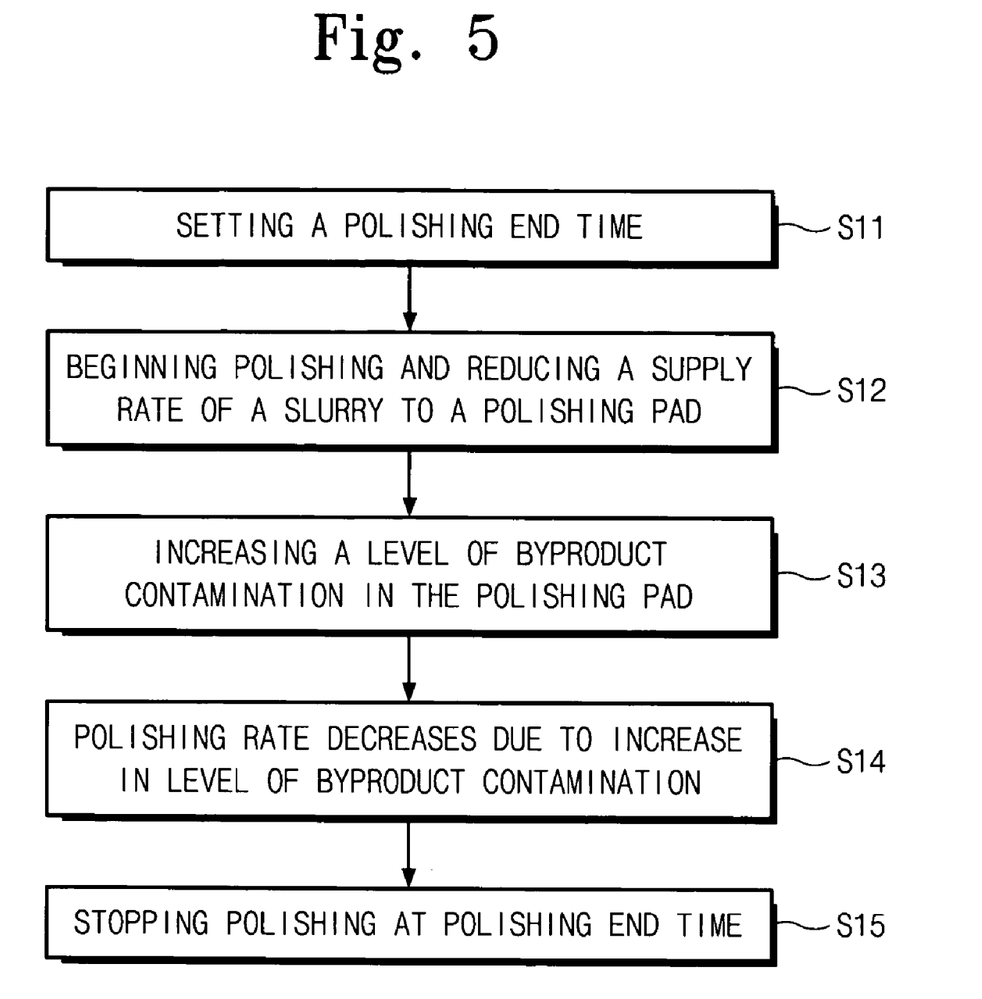
FIGS. 5 through 7 are flow charts of methods of CMP using control methods according to a first through a third embodiment of the present invention.

FIG. 5 is a flow chart illustrating a first embodiment of the present invention.

Referring FIG. 5, in step S11, the polishing end time is set.

In step S12, a polishing pad containing a slurry contacts a substrate and the substrate is rotated relative to the polishing pad to begin polishing, i.e., abrading, the substrate. While the substrate is being polished, a supply rate of the slurry to the polishing pad is decreased. The supply rate of the slurry can be gradually decreased using a control valve.

In step S13, as the supply rate of the slurry to the polishing pad decreases, a level of byproduct contamination in the polishing pad increases. Generally, the polishing pad is only conditioned when a sufficient amount of slurry is supplied to the polishing pad. In the first embodiment of the present invention, however, the slurry is not sufficiently supplied to condition the polishing pad. As a result of this lack of conditioning, the level of byproduct contamination in the polishing pad increases, the polishing pad becomes glazed by the contaminated byproducts, and thus, in step S14, the polishing rate decreases.

In step S15, the polishing process stops at the polishing end time.

By adjusting the supply rate of the slurry, the polishing rate can be made to approximately equal zero when the polishing amount reaches a target value. It is preferable that the polishing end time is set to a time subsequent to the time at which the polishing rate approximately equals zero. Accordingly, even if progress of the polishing equipment is delayed in achieving the target value, an error may be prevented from occurring during the process because the polishing end time has not yet been reached.

Figure 6:
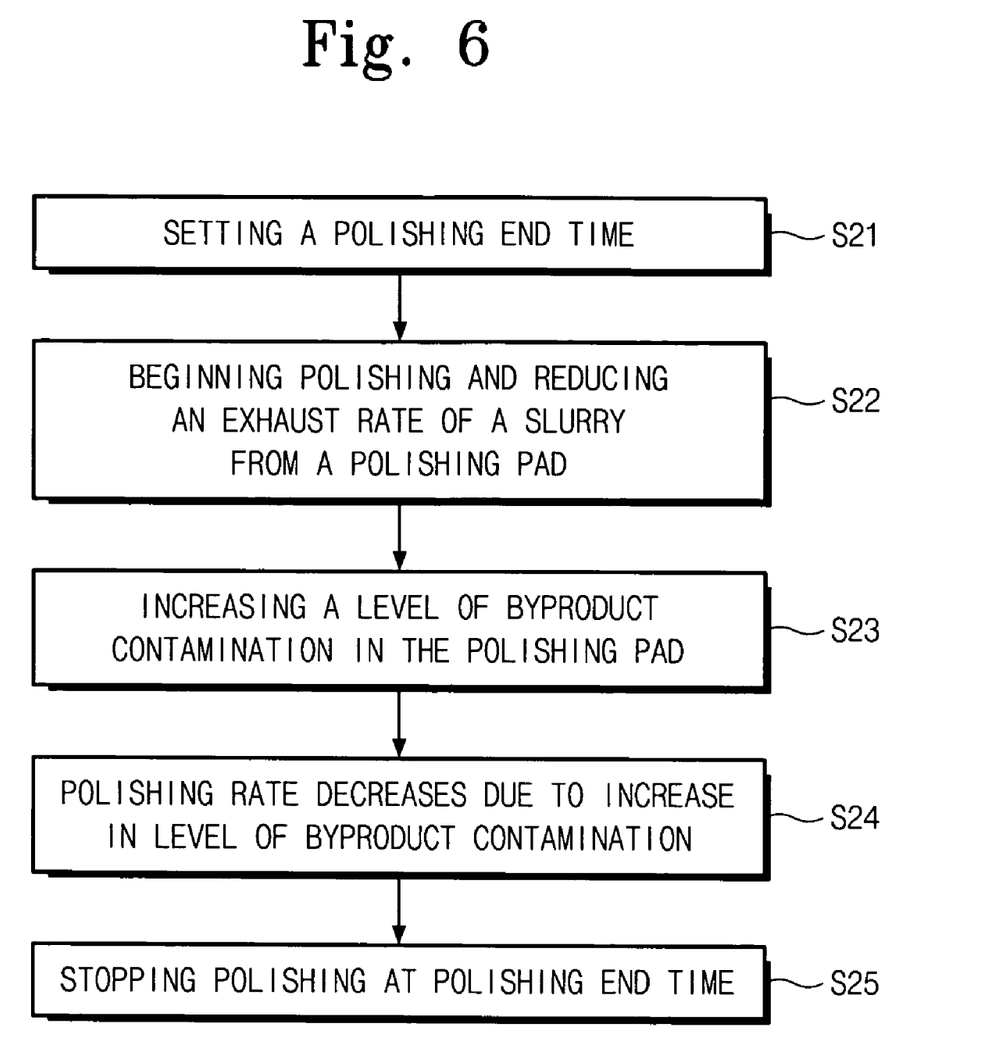

FIG. 6 is a flow chart illustrating a second embodiment of the present invention.

Referring to FIG. 6, in step S21, the polishing end time is set.

In step S22, a polishing pad containing a slurry contacts a substrate and the substrate is rotated relative to the polishing pad to being polishing, i.e., abrading, the substrate. While the substrate is being polished, an exhaust rate of the slurry from the polishing pad is decreased. The exhaust rate of the slurry can be gradually decreased using a control valve.

In step S23, as the exhaust rate of the slurry from the polishing pad is decreased, a level of byproduct contamination in the polishing pad increases. Generally, the polishing pad is only conditioned when a sufficient amount of slurry is exhausted from the polishing pad. In the second embodiment of the present invention, however, the slurry is not sufficiently exhausted to condition the polishing pad. As a result of this lack of conditioning, the level of byproduct contamination in the polishing pad increases, the polishing pad becomes glazed by the contaminated byproducts, and thus, in step S24, the polishing rate decreases.

In step S25, the polishing process stops at the polishing end time.

By adjusting the exhaust rate of the slurry, the polishing rate can be made to approximately equal zero when the polishing amount reaches a target value. It is preferable that the polishing end time is set to a time subsequent to the time at which the polishing rate approximately equals zero. Accordingly, even if progress of the polishing equipment is delayed in achieving the target value, an error may be prevented from occurring during the process because the polishing end time has not yet been reached.

Figure 7:
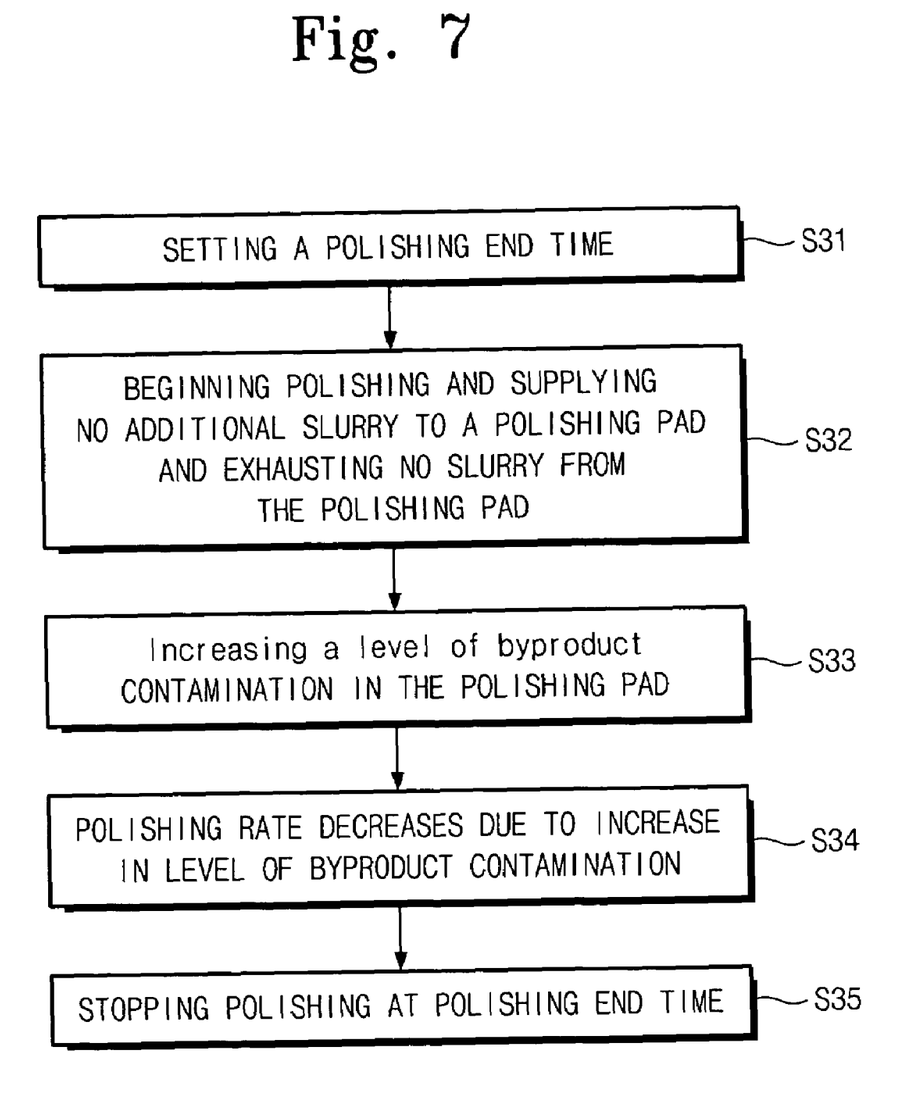

FIG. 7 is a flow chart illustrating a third embodiment of the present invention.

Referring to FIG. 7, in step S31, the polishing end time is set.

In step S32, a polishing pad containing a slurry contacts a substrate and the substrate is rotated relative to the polishing pad to being polishing, i.e., abrading, the substrate. In the third embodiment of the present invention, the polishing is performed using a polishing pad that contains a predetermined amount of the slurry. No additional slurry is supplied to or exhausted from the polishing pad during the polishing process. Thus, a polishing amount depends on an initial amount of the slurry contained in the polishing pad. It is preferable to adjust the initial amount of the slurry so that the polishing rate will decrease as the polishing process progress, thereby converging the polishing amount to a target value.

In step S33, a level of byproduct contamination in the polishing pad increases. Generally, the polishing pad is conditioned when a sufficient amount of slurry is supplied to and exhausted from the polishing pad. In the third embodiment of the present invention, however, a predetermined amount of slurry is initially supplied to the polishing pad, and no additionally slurry is supplied to the polishing pad nor is any slurry exhausted from the polishing pad after the polishing process has started. As a result, the level of byproduct contamination in the polishing pad increases, the polishing pad becomes glazed by the contaminated byproducts, and thus, in step S34, the polishing rate decreases.

In step S35, the polishing process stops at the polishing end time.

By adjusting the initial supply of the slurry, the polishing rate can be made to approximately equal zero when the polishing amount reaches a target value. It is preferable that the polishing end time is set to a time subsequent to the time at which the polishing rate approximately equals zero. Accordingly, even if progress of the polishing equipment is delayed in achieving the target value, an error may be prevented from occurring during the process because the polishing end time has not yet been reached.

In the control methods shown in FIGS. 5 through 7, the slurry may be a material that has a high polishing rate with respect to the target layer. The slurry may be selected independent of a polishing selectivity with respect to the target layer relative to the under-layer. More specifically, the slurry may have a polishing selectivity that is lower with respect to the target material relative than to an under-layer and still may have a polishing rate that is higher with respect to the target material than the under-layer.

The present invention may further include an additional polishing process using a slurry having a high selectivity with respect to the target layer relative to the under-layer. For example, in a process of planarization, throughput can be increased by using a slurry having a high polishing rate. In a process of forming a conductive plug, an additional polishing process is performed to prevent residue from forming on the under-layer beneath a target layer. More specifically, a first polishing may be performed with a first slurry having a high polishing rate, and second polishing may be performed with a second slurry having a high selectivity.

Because byproducts in a slurry deteriorate a polishing rate, in conventional methods, the slurry is continuously supplied during a process of polishing and contaminated slurry is continuously exhausted to eliminate the byproducts. In contrast, the present invention purposefully reduces the polishing rate, e.g., by using the byproducts. In particular, the level of byproduct contamination in a polishing pad is increased to decrease the polishing rate. By adjusting the level of byproduct contamination in the polishing pad, the polishing end point can be controlled.

More specifically, in the present invention, the exhaust of the slurry from the polishing pad or the supply of the slurry to the polishing pad may be reduced to increase the level of byproduct contamination in the polishing pad. In one embodiment of the present invention, while the exhaust of the slurry from the polishing pad is reduced, the supply of the slurry into the polishing pad may be also reduced to increase the level of byproduct contamination in the polishing pad. It is preferable that the substrate is polished by a slurry that has high polishing rate to the target layer. Therefore, the throughput of the polishing can be improved. In addition, after the polishing end time, over-polishing may be performed by a slurry that has a higher polishing selectivity of the target layer relative to the under-layer beneath the target layer. As a result, it is possible to remove the target layer completely.

According to the present invention as described above, the amount of the byproduct contaminated in the polishing pad is increased so that the polishing rate approximately equals zero as the polishing amount approaches the target value. Therefore, the polishing process spontaneously stops as the polishing amount approaches the target value.

As compared with a conventional method, the method according to the present invention encounters relatively few errors in the process because a variation in the polishing amount is very low near the polishing end time, even if the equipment has been operated for an extended period of time and the end point has shifted.

In the present invention, the polishing rate is approximately zero at the polishing end time. Therefore, it is possible to use a slurry having a high polishing rate, even if the slurry has a low selectivity with respect to the target layer. As a result, the throughput of the polishing process can be improved.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of chemical mechanical polishing that polishes a substrate by abrading a target material formed on the substrate with a polishing pad containing a slurry, comprising:
    setting a polishing end time, at which time a predetermined thickness of the target material will have been removed from the substrate by polishing;
    polishing the substrate to remove the predetermined thickness of the target material; and
    increasing a level of byproduct contamination in the polishing pad to decrease a polishing rate, while polishing the substrate, so that the polishing rate decreases to approximately zero at the polishing end time.

2. The method as claimed in claim 1, wherein increasing the level of byproduct contamination in the polishing pad comprises reducing an exhaust rate of the slurry from the polishing pad.

3. The method as claimed in claim 1, wherein increasing the level of byproduct contamination in the polishing pad comprises reducing a supply rate of the slurry to the polishing pad.

4. The method as claimed in claim 1, wherein increasing the level of byproduct contamination in the polishing pad comprises blocking a supply of the slurry to the polishing pad and blocking an exhaust of the slurry from the polishing pad.

5. The method as claimed in claim 1, wherein polishing the substrate uses a slurry having a polishing selectivity that is lower with respect to the target material than to an under-layer and a polishing rate that is higher with respect to the target material than the under-layer.

6. The method as claimed in claim 1, further comprising:
    polishing the substrate using a slurry having a polishing selectivity that is higher with respect to the target material than to an under-layer, after the polishing end time.

7. The method as claimed in claim 1, wherein polishing the substrate comprises:

polishing the substrate using a first slurry having a low polishing selectivity with respect to the target material relative to an under-layer and a polishing rate that is higher with respect to the target material than an under-layer, until the polishing end time; and polishing the substrate using a second slurry having a polishing selectivity that is higher with respect to the target material than to the under-layer, after the polishing end time.

8. A method for polishing a substrate, on which a target material is formed on an under-layer, by abrading the target material with a polishing pad containing a slurry, comprising:

setting a polishing end time, at which time a predetermined thickness of the target material will have been removed from the substrate by polishing;

polishing the substrate to remove the predetermined thickness of the target material; and increasing a level of byproduct contamination in the polishing pad to decrease a polishing rate, while polishing the substrate, so that the polishing rate decreases to approximately zero at the polishing end time; and stopping the polishing at the polishing end time.

9. A method for polishing a substrate as claimed in claim 8, wherein increasing the level of byproduct contamination in the polishing pad to decrease the polishing rate comprises reducing a supply rate of the slurry to the polishing pad.

10. The method as claimed in claim 9, wherein the substrate is polished by a slurry having a polishing selectivity that is lower with respect to the target material than to the under-layer and a polishing rate that is higher with respect to the target material.

11. The method as claimed in claim 9, further comprising polishing the substrate using a slurry having a polishing selectivity that is higher with respect to the target material than to an under-layer, after the polishing end time.

12. The method as claimed in claim 9, wherein polishing the substrate comprises:

polishing the substrate using a first slurry having a low polishing selectivity with respect to the target material relative to an under-layer and a polishing rate that is higher with respect to the target material than the under-layer, until the polishing end time; and polishing the substrate using a second slurry having a polishing selectivity that is higher with respect to the target material than to the under-layer, after the polishing end time.

13. The method for polishing a substrate as claimed in claim 8, wherein increasing the level of byproduct contamination in the polishing pad to decrease the polishing rate comprises reducing an exhaust rate of the slurry from the polishing pad.

14. The method as claimed in claim 13, wherein the substrate is polished by a slurry having a polishing selectivity that is lower with respect to the target material than to the under-layer and a polishing rate that is higher with respect to the target material.

15. The method as claimed in claim 13, further comprising polishing the substrate using a slurry having a polishing selectivity that is higher with respect to the target material than to an under-layer, after the polishing end time.

16. The method as claimed in claim 13, wherein polishing the substrate comprises:

polishing the substrate using a first slurry having a low polishing selectivity with respect to the target material relative to an under-layer and a polishing rate that is higher with respect to the target material than the under-layer, until the polishing end time; and polishing the substrate using a second slurry having a polishing selectivity that is higher with respect to the target material than to the under-layer, after the polishing end time.

17. The method for polishing a substrate as claimed in claim 8, wherein increasing the level of byproduct contamination in the polishing pad to decrease the polishing rate comprises blocking a supply of the slurry to the polishing pad and blocking an exhaust of the slurry from the polishing pad.

18. The method as claimed in claim 17, wherein the substrate is polished by a slurry having a polishing selectivity that is lower with respect to the target material than to the under-layer and a polishing rate that is higher with respect to the target material.

19. The method as claimed in claim 17, further comprising polishing the substrate using a slurry having a polishing selectivity that is higher with respect to the target material than to an under-layer, after the polishing end time.

20. The method as claimed in claim 17, wherein polishing the substrate comprises:

polishing the substrate using a first slurry having a low polishing selectivity with respect to the target material relative to an under-layer and a polishing rate that is higher with respect to the target material than the under-layer, until the polishing end time; and polishing the substrate using a second slurry having a polishing selectivity that is higher with respect to the target material than to the under-layer, after the polishing end time.

21. The method as claimed in claim 8, wherein the substrate is polished by a slurry having a polishing selectivity that is lower with respect to the target material than to the under-layer and a polishing rate that is higher with respect to the target material.

22. The method as claimed in claim 8, further comprising polishing the substrate using a slurry having a polishing selectivity that is higher with respect to the target material than to an under-layer, after the polishing end time.

23. The method as claimed in claim 8, wherein polishing the substrate comprises:

polishing the substrate using a first slurry having a low polishing selectivity with respect to the target material relative to an under-layer and a polishing rate that is higher with respect to the target material than the under-layer, until the polishing end time; and polishing the substrate using a second slurry having a polishing selectivity that is higher with respect to the target material than to the under-layer, after the polishing end time.

* * * * *